United States Patent [19]
Torigoe

[11] Patent Number: 5,231,471
[45] Date of Patent: Jul. 27, 1993

[54] ALIGNMENT AND EXPOSURE APPARATUS

[75] Inventor: Makoto Torigoe, Kawasaki, Japan

[73] Assignee: Canon Kabushiki Kaisha, Tokyo, Japan

[21] Appl. No.: 795,258

[22] Filed: Nov. 19, 1991

Related U.S. Application Data

[63] Continuation of Ser. No. 555,680, Jul. 18, 1990, abandoned, which is a continuation of Ser. No. 29,773, Mar. 24, 1987, abandoned.

[30] Foreign Application Priority Data

| Mar. 25, 1986 [JP] | Japan | 61-067584 |
| Feb. 25, 1987 [JP] | Japan | 62-043506 |
| Mar. 10, 1987 [JP] | Japan | 62-053043 |

[51] Int. Cl.⁵ .................................................. H01L 21/30
[52] U.S. Cl. ...................................... 356/401; 353/53
[58] Field of Search ............................ 356/401; 355/53

[56] References Cited

U.S. PATENT DOCUMENTS

| 4,571,712 | 2/1986 | Romano et al. | 369/44.33 |
| 4,573,791 | 3/1980 | Phillips | 355/53 |
| 4,641,035 | 2/1987 | Suzuki et al. | 356/408 |
| 4,752,668 | 6/1988 | Rosenfield et al. | 219/121 LH |

FOREIGN PATENT DOCUMENTS 61-73329  4/1986  Japan.

OTHER PUBLICATIONS

"Square Blue Laser Focuses Ultraviolet Energy" Schefter *Popular Science* May 1983.
Nikeei Microdevices, Feb. 1987 issue, pp. 113-124.
"Photo-etching of PMMA by Excimer Laser Irradiation", Study on Laser, vol. 8, No. 6, pp. 941-943 and translation.
"Photoablation of Resist Coated Alignment Targets to Improve VLSI Pattern Overlay", Lasers in Microlithography, SPIE, vol. 774, (1987), pp. 172-180.
"Lithographic Trends", Semiconductor International, vol. 23, Dec. 1986.

*Primary Examiner*—Richard A. Rosenberger
*Attorney, Agent, or Firm*—Fitzpatrick, Cella, Harper & Scinto

[57] ABSTRACT

An alignment mark detecting device usable with an exposure apparatus for transferring a pattern of an original onto a workpiece having a radiation-sensitive layer, includes a holder for holding the workpiece, a radiation energy source for irradiating the workpiece held by the holder with radiation energy to remove a portion of the radiation-sensitive layer adjacent to an alignment mark formed on the workpiece, and a holder for detecting the alignment mark of the workpiece held by the holder.

25 Claims, 7 Drawing Sheets

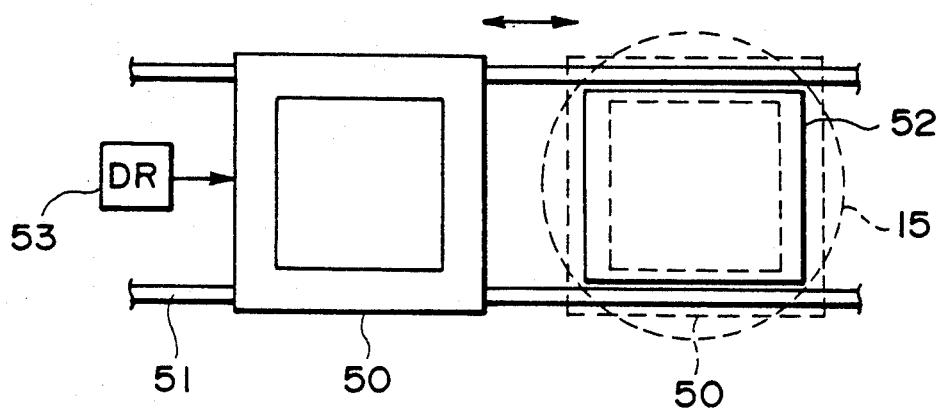
F I G. 5
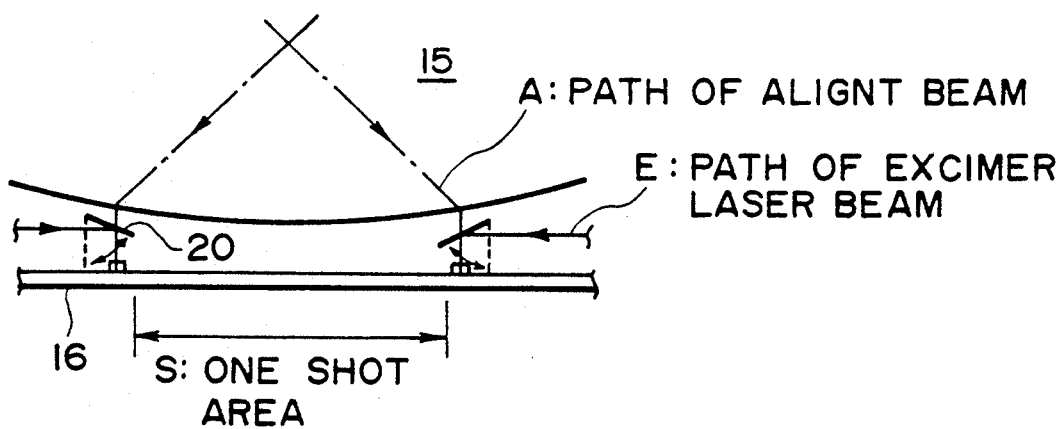
F I G. 7

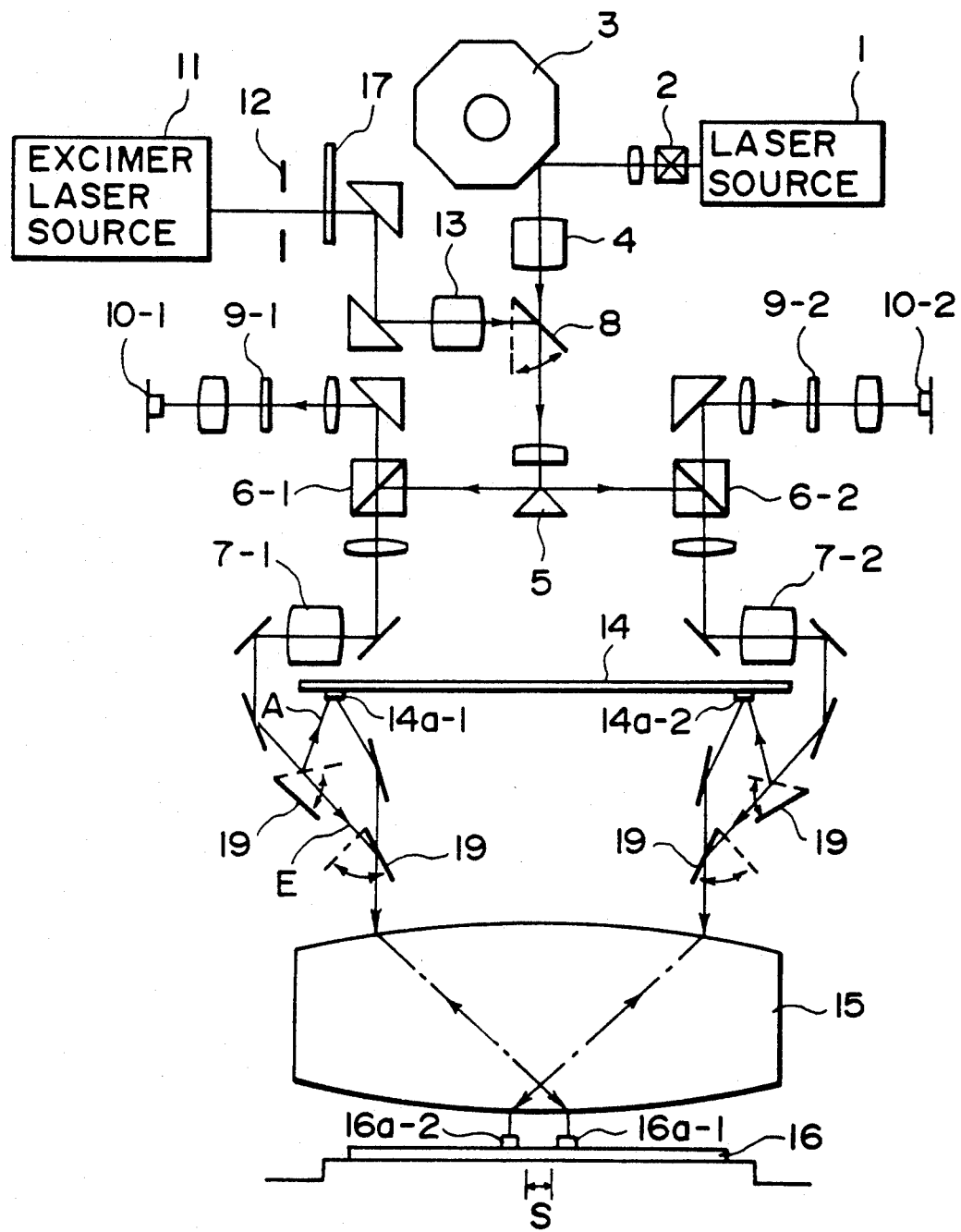
F I G. 6

ALIGNMENT AND EXPOSURE APPARATUS

This application is a continuation of application Ser. No. 07/555,680, filed Jul. 18, 1990, now abandoned which is a continuation of application Ser. No. 07/029,773, filed Mar. 24, 1987, was abandoned.

FIELD OF THE INVENTION AND RELATED ART

This invention relates to an exposure apparatus and, more particularly, to an alignment and exposure apparatus for use in the manufacture of semiconductor devices such as integrated circuits.

In the field of the manufacture of semiconductor devices, alignment and exposure apparatuses have been used for photolithographically transferring a pattern of a mask or reticle onto a semiconductor wafer. Usually, the semiconductor wafer is coated with a photosensitive material, forming a surface layer, which is to be sensitized by the irradiation with radiation energy typically light energy. For assuring high-accuracy pattern transfer, the wafer should be accurately aligned with respect to the mask or reticle. For this purpose, the wafer is usually provided with one or more alignment marks, each of which is formed by a step (recess or protrusion) defined on the wafer surface. An alignment light beam is projected upon such alignment mark and, usually, diffractively scattered light from the alignment mark is photoelectrically detected. On the basis of positional information obtainable from the photoelectric detection, wafer alignment is executed.

When a photosensitive material such as, for example, photosensitive resin (hereinafter "photoresist" or "resist"), is applied to the wafer surface to form thereon a surface layer, it is very possible that the thickness of such a resist layer covering the portion of the wafer surface in which the alignment mark is formed is not symmetrical with respect to the alignment mark. That is, on opposite sides of the alignment mark, the photoresist layer is liable to have different thickness. If this occurs, when the light beam is projected upon the alignment mark, diffractively scattered light rays from the alignment mark advance asymmetrically, which adversely affects the accuracy with which the position is detected.

Further, when the light beam used for alignment which is incident on the alignment mark has a wavelength which is equal to or substantially equal to that of the light to be used for the exposure (photolithographic pattern transfer), it is possible that the light for alignment is absorbed by the photoresist material to a substantial degree, with the result that only an insufficient quantity of diffractively scattered light is photoelectrically detected for the purpose of position detection.

SUMMARY OF THE INVENTION

It is accordingly a primary object of the present invention to provide an alignment and exposure apparatus which is free from the disadvantageous effects of the photoresist material as described above.

It is another object of the present invention to provide an alignment mark detecting method in which the adverse affects of a photosensitive surface layer, as described hereinbefore, can be avoided.

Briefly, in accordance with one aspect of the present invention, there is provided an alignment mark detecting device usable with an exposure apparatus for transferring a pattern of an original onto a workpiece having a radiation-sensitive layer. The device comprises:
means for holding the workpiece;
means for irradiating the workpiece held by the holding means with radiation energy to remove a portion of the radiation-sensitive layer adjacent to an alignment mark formed on the workpiece; and
means for detecting the alignment mark of the workpiece held by the holding means.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 5 is a schematic view illustrating the sliding movement of a slider.

FIG. 6 is a schematic and diagrammatic view of an alignment optical system employed in an alignment and exposure apparatus according to another embodiment of the present invention.

FIG. 7 is a partial schematic view of an alignment optical system employed in an alignment and exposure apparatus according to a further embodiment of the present invention.

DESCRIPTION OF THE PREFERRED EMBODIMENTS

Figure 1:
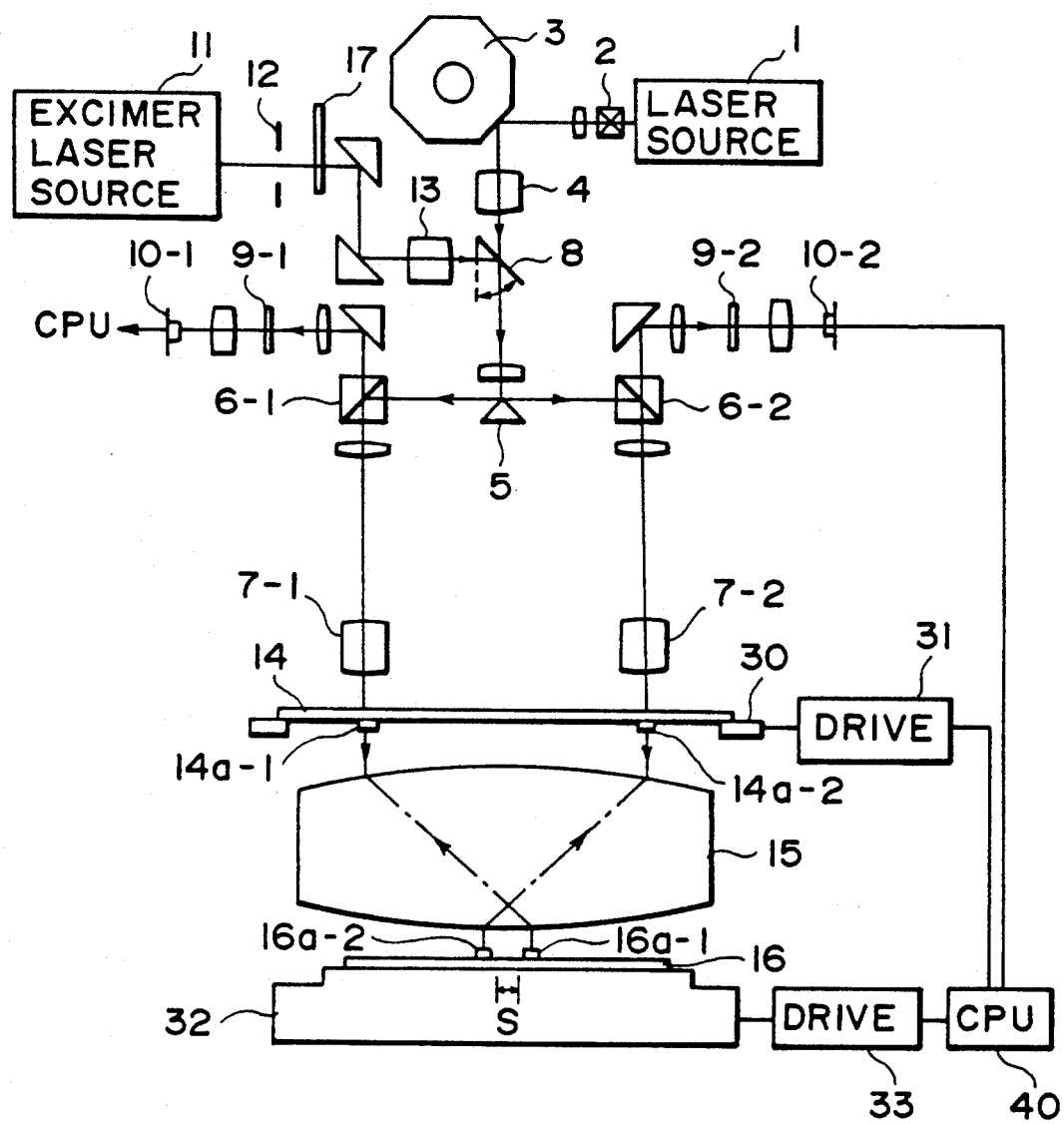
FIG. 1 is a schematic and diagrammatic view of an alignment optical system employed in an alignment and exposure apparatus according to one embodiment of the present invention.

Referring first to FIG. 1, there is shown an alignment optical system included in an alignment and exposure apparatus according to one embodiment of the present invention.

As shown in FIG. 1, the alignment system includes an Argon-ion laser source 1, a wavelength controller 2 such as a "second harmonics generator" (hereinafter "SHG"), a polygonal mirror 3, an f-$\theta$ lens 4, a roof prism 5, polarization beam splitters 6-1 and 6-2, objective lenses 7-1 and 7-2, a swingable mirror 8 having reflecting surfaces formed on its opposite sides, stoppers (spatial filters) 9-1 and 9-2, photodetectors 10-1 and 10-2, a KrF excimer laser source 11, an aperture member 12, a relay lens 13, a projection optical system 15 for projecting an image of a reticle 14 onto a wafer 16 on a reduced scale, and a light-quantity adjusting mechanism 17.

The reticle 14 has alignment marks 14a-1 and 14a-2 formed on its lower surface. On the other hand, the wafer 16 has alignment marks 16a-1 and 16a-2. The reticle 14 is carried on and held by a reticle stage 30. A reticle stage driver 31 is arranged to move the reticle stage 30 for the purpose of reticle positioning. The wafer 16 is carried on and held by a wafer stage 32. A wafer stage driver 33 is arranged to move the wafer stage 32 for the purpose of wafer positioning. A central processing unit 40 (hereinafter "CPU") is adapted to receive electrical signals from the photodetectors 10-1 and 10-2 and, on the basis of these signals, detects the relative position of the reticle 14 and the wafer 16. Also, the CPU 40 is arranged to control various operations to be made in the alignment and exposure apparatus, such as the swingable movement of the mirror 8, the actuation of the reticle stage driver 31 and the wafer stage driver 33, the actuation of the laser sources 1 and 11, etc.

In this embodiment, the laser source 1 produces a laser beam having a wavelength of approx. 496.5 nm. The laser beam from the source 1 enters into the SHG 2 whereby the wavelength of the laser beam is reduced approximately to one half of its original wavelength. Thus, a laser beam of approx. 248.2 nm in wavelength is emitted from the SHG 2. The laser beam from the SHG 2 is incident on a rotating polygonal mirror 3 and, then, is projected upon the roof prism 5 by way of the f-$\theta$ lens 4. By the roof prism 5, the laser beam is deflected rightwardly and leftwardly in sequence. The laser beam from the roof prism 5 enters into the polarization beam splitter 6-1 (6-2) and the objective lens 7-1 (7-2) and is incident upon the reticle 14. The laser beam passing through the reticle 14 is projected upon the wafer 16 by means of the projection optical system 15. In this manner, the wafer 16 as well as the reticle 14 are scanned with the laser beam from the laser source 1. Prior to such optical scanning, the wafer 16 is relatively coarsely aligned, on the wafer stage 32. At the time of optical scanning of the reticle 14 and the wafer 16, the mirror 8 is at a broken-line position shown in FIG. 1. While only two wafer alignment marks 16a-1 and 16a-2 are shown in FIG. 1, this is only for the purpose of illustration. Actually, for each different shot area on the wafer, one or more wafer alignment marks (two in this case) are formed. One of the shot areas on the wafer is depicted at S in FIG. 1. Each alignment mark is defined by a step (recess or protrusion) formed on the wafer surface or reticle surface. Only such light rays as diffractively scattered by the edges of the alignment mark pass through the stopper (spatial filter) 9-1 or 9-2 and impinge upon the photodetector 10-1 or 10-2. By this arrangement, the position of the alignment mark is detected. In accordance with the mark position detection, the reticle and the wafer are relatively moved so that they are automatically aligned. In the present embodiment, for such an alignment purpose, the reticle stage 30 is moved by the reticle stage driver 31 under the direction of the CPU 40. After alignment is achieved, an additional KrF excimer laser source (not shown) is used to photolithographically transfer a circuit pattern (not shown) formed on the reticle 14 onto the wafer 16, with the aid of the projection optical system 15.

In accordance with the present embodiment, the mirror 8 is moved to its solid-line position shown in FIG. 1, prior to the initiation of the automatic alignment operation described hereinbefore. After the mirror 8 is moved to the solid line position, the excimer laser source 11 is energized, whereby it produces a laser beam which, in this embodiment, has a wavelength of approx. 248.5 nm. As described in the introductory part of this Specification, the wafer 16 surface is coated with a photosensitive material or photoresist material. Thus, a photoresist surface layer is formed on the wafer 16. In the present embodiment, the laser beam from the excimer laser source 11 is used to remove, partially or completely, such a portion of the photoresist layer that is applied to a wafer surface portion including a wafer alignment mark, as will be described later in more detail. By moving the mirror 8 to its solid-line position, the laser beam from the excimer laser source 11 can impinge upon the wafer 16. More specifically, the laser beam from the excimer laser 11 passes through the aperture member 12, the light-quantity adjusting mechanism 17 which may comprise a variable-transmission type neutral density filter (ND filter) or the like, and the relay lens 13, so that the laser beam is incident on the mirror 8. The laser beam reflected by the mirror 8 is incident upon the roof prism 5 whereby it is divided into two laser beams advancing rightwardly and leftwardly as viewed in FIG. 1. The laser beams from the roof prism 5 are projected upon the reticle alignment marks 14a-1 and 14a-2 and, accordingly, the wafer alignment marks 16a-1 and 16a-2.

Figure 2:
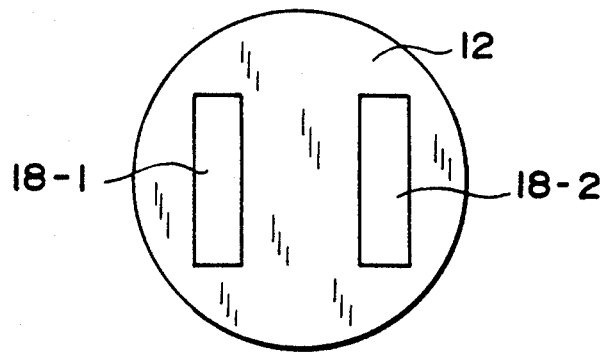
FIG. 2 is a plan view of an aperture member used in the alignment optical system of the FIG. 1 embodiment.

An example of the structure of the aperture member 12 is illustrated in FIG. 2. Denoted in this Figure, by numerals 18-1 and 18-2 are apertures or openings formed in the aperture member 12. As seen from FIG. 2, actually in the present embodiment two excimer laser beams are directed from the openings of the aperture member 12, to the roof prism 5 by which they are deflected rightwardly and leftwardly, respectively. In the present embodiment, the aperture member 12 is disposed in an imaging relation with the upper surface of the wafer 16. As a result, the openings of the aperture member 12 can be imaged upon the wafer alignment marks 16a-1 and 16a-2, respectively. This means that only the wafer alignment mark and the portion of the wafer surface in the neighborhood of the alignment mark can be irradiated with the excimer laser beam. Further, in this embodiment, a portion of the alignment optical system is used for the irradiation of the excimer laser beam. Therefore, the optical arrangement can be made compact.

Each of the openings 18-1 and 18-2 of the aperture member 12 should have a size sufficient for the image of the opening, as projected on the wafer 16 surface, to cover the wafer alignment mark 16a-1 or 16a-2. However, the size of the opening should preferably be restricted so as to avoid irradiation of a circuit pattern area on the wafer (the area onto which the reticle circuit pattern is to be transferred) with the excimer laser beam from the excimer laser 11. In any event, the position and the size of each opening of the aperture member 12 should be adjusted so as to assure that the image of the opening, as projected on the wafer surface, sufficiently covers the wafer alignment mark 16a-1 or 16a-2, with the wafer 16 being relatively coarsely aligned.

For each resist material used, the quantity of irradiation of the excimer laser beam from the excimer laser 11 is adjusted by means of the adjusting mechanism 17. It is known that, when a resist material is irradiated by short-wavelength electromagnetic radiation such as an excimer laser beam with high irradiation power density, the irradiated portion of the resist material is eliminated. It is considered that such elimination may possibly result from depolymerization of the resist material. That is, the elimination may be caused by scattering of fine powder of the resist material. The degree of elimination depends on the magnitude of the irradiation. The present invention uses such an effect. That is, by use of the adjusting mechanism 17, the quantity of the excimer laser beam from the excimer laser 11 is suitably adjusted, and the thus adjusted laser beam is projected upon the alignment mark of the wafer 16 by means of the optical arrangement described hereinbefore. By doing so, the resist material applied to the wafer alignment mark 16a-1 or 16a-2 and to the wafer surface portion in the neighborhood of the wafer alignment mark, can be eliminated partially or completely.

After such resist elimination, the mirror 8 is moved to its broken-line position and the optical scanning of the wafer by use of the laser beam from the laser source 1 is executed. Since the resist material on or adjacent the wafer alignment mark has been eliminated, the disadvantageous effect of the resist layer, such as the degradation of position detection accuracy due to asymmetrical thickness of the resist layer and the insufficiency in the quantity of diffractively scattered light rays due to the absorption of light by the resist material, as described hereinbefore, can be avoided.

Since, the region to be irradiated by the excimer laser beam is approximately coincident with the region to be scanned by the laser beam from the laser source 1. at least a portion of the optical arrangement provided for the alignment can be used as at least a portion of the optical arrangement of the optical system provided for the resist elimination. Accodingly, the optical arrangement of the alignment and exposure apparatus, as a whole, can be made compact. The mirror 8 may, of course, be replaced by a half mirror.

In the present embodiment, the wavelength of the laser beam used for the resist elimination (i.e. approx. 248.5 nm) is substantially equal to the wavelength of the laser beam used for the alignment (i.e. approx. 248.2 nm). It is, therefore, possible that, when at the time of laser beam irradiation for the resist elimination, the reticle alignment mark 14a-1 (14a-2) is included in a region to be irradiated with the resist eliminating excimer laser beam, the image of the reticle alignment mark 14a-1 (14a-2) is formed on the wafer 16, with the result that the portion of the photoresist material on which the image of the reticle alignment mark is formed cannot be eliminated. In view of this, according to the present embodiment, the reticle 14 is displaced at the time of irradiation of the resist eliminating excimer laser beam, so that the resist eliminating excimer laser beam is incident on a region on the reticle 14 not containing a circuit pattern or alignment mark. By doing so, the resist eliminating excimer laser beam can transmit through the reticle without imaging the reticle alignment mark. Thereafter, for the alignment purpose, the reticle 14 is moved back to the alignment position that allows alignment by use of the reticle alignment marks and the wafer alignment marks with the aid of the alignment optical system. The displacement of the reticle for the above-described purpose is achieved by driving the reticle stage 30 by means of the reticle stage driver 31 in accordance with instruction signals supplied from the CPU 40. Where an X-Y laser interferometer system is used for the measurement of the reticle position, the reticle displacement can be controlled with a high accuracy, sufficient for executing the alignment after the irradiation of the resist eliminating laser beam.

As an alternative for preventing formation of the image of the reticle alignment mark on the wafer at the time of the resist elimination, the wavelength of the laser beam from the excimer laser 11 may be changed. That is, different wavelengths are used for the alignment and for the resist elimination. By doing so, at the time of resist elimination, the light from the reticle alignment mark is defocused on the wafer 16, with the result that the reticle alignment mark is not imaged on the wafer 16. If this is desired, the optical arrangement for the resist elimination, e.g. the relay lens 13, is adjusted such that the excimer laser beam having an adjusted wavelength forms, on the wafer 16, the image of the opening 18-1 (18-2) of the aperture member 12 with the aid of a portion of the optical arrangement of the alignment optical system.

Suitable shutter means may be introduced in front of the photodetector 10-1 (10-2) or suitable means may be used to intercept a portion of the detecting optical system, at the time of irradiation of the resist eliminating laser beam, in order to protect the photodetector against damage due to the irradiation of the excimer laser beam.

Figure 3:
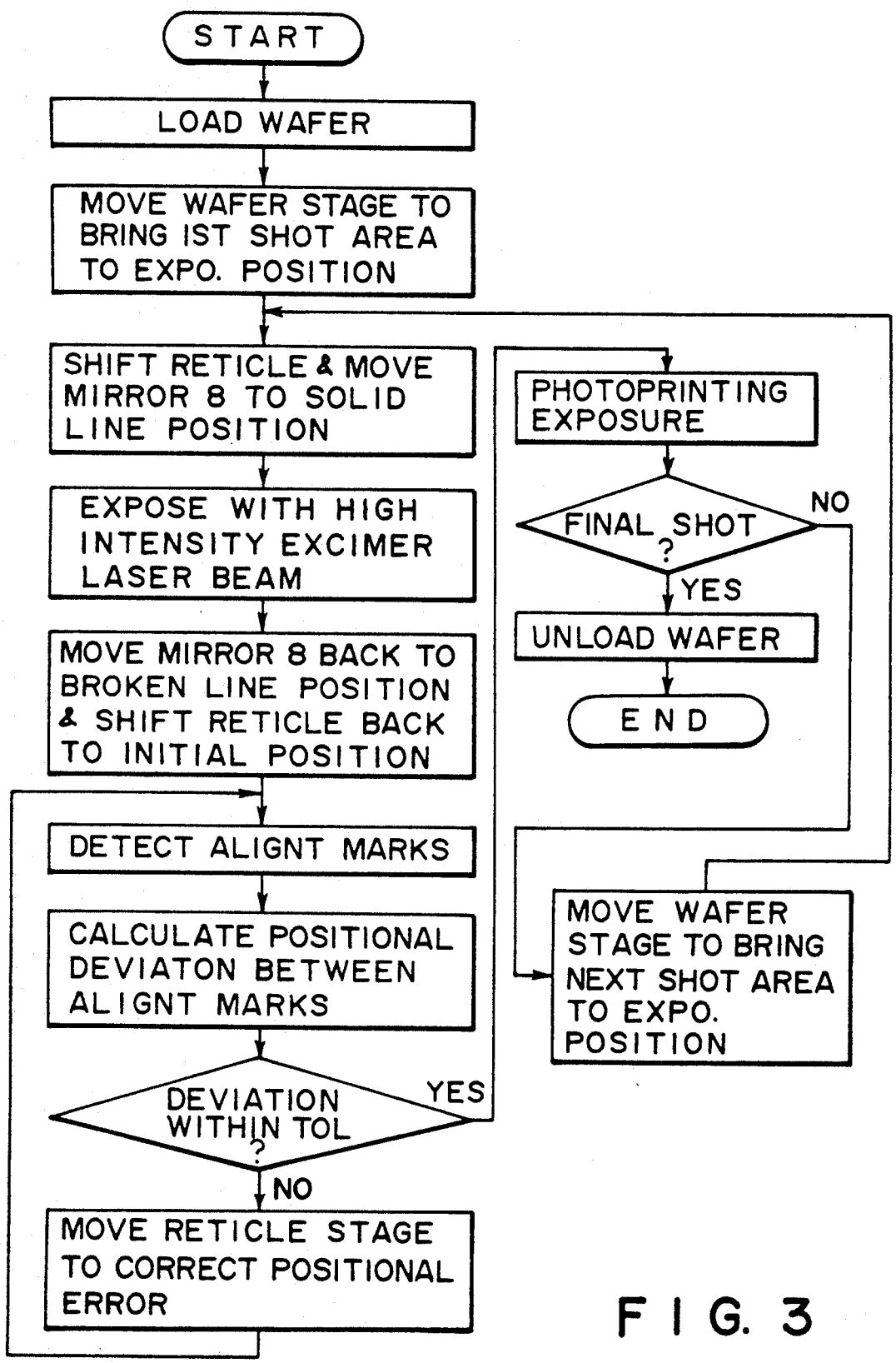
FIG. 3 is a flow chart showing the sequence of the alignment and exposure operation in the alignment and exposure apparatus of FIG. 1.
Figure 4:
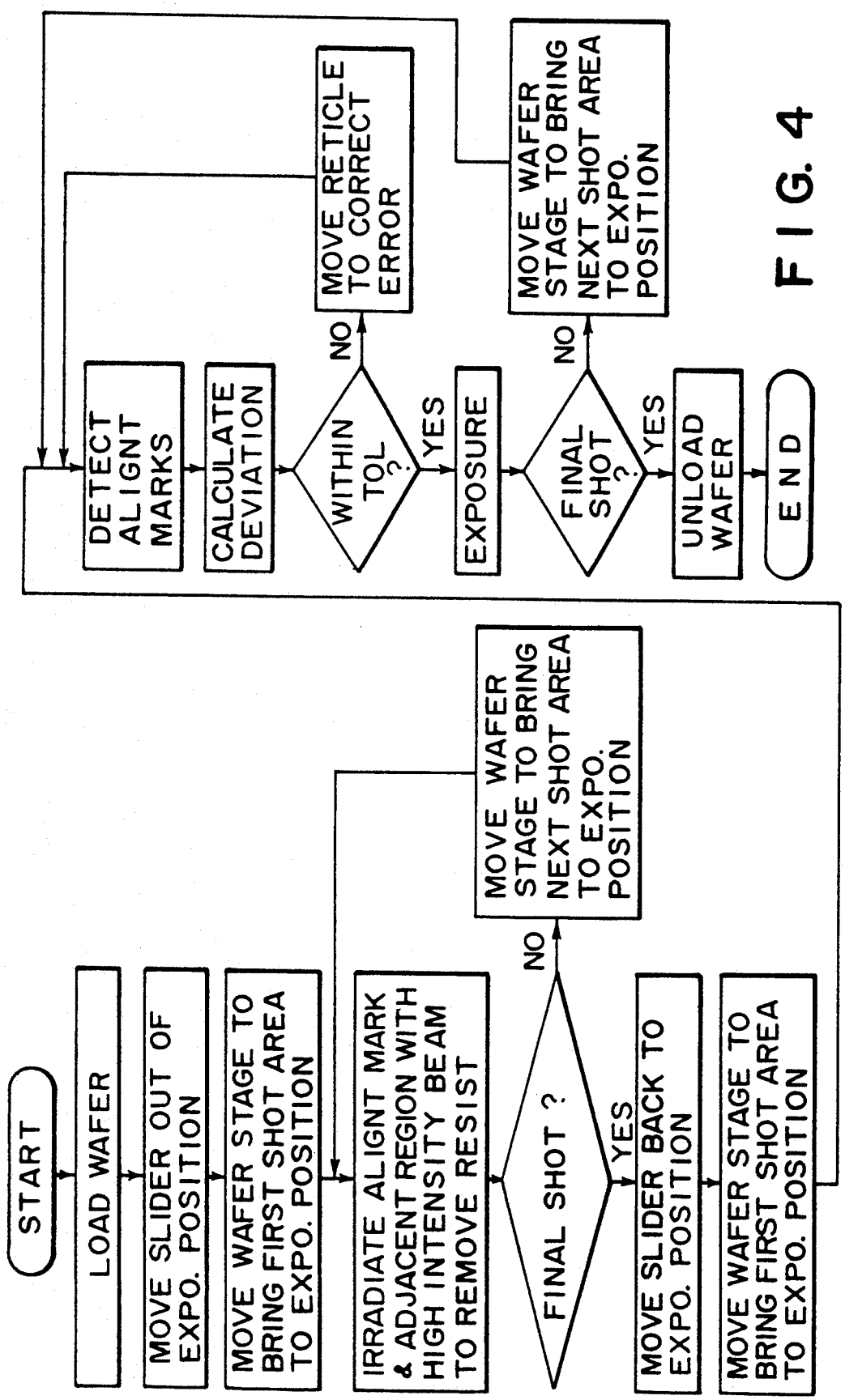
FIG. 4 is a flow chart showing a modified form of the alignment and exposure operation, according to the present embodiment.

The flow of the alignment and exposure operation in the alignment and exposure apparatus of the present embodiment is illustrated in FIG. 3. As will be seen from FIG. 3, in the present embodiment, resist elimination is carried out each time one shot area on the wafer is moved to the exposure position. However, the invention is not so limited. For example, resist elimination may be preparatorily carried out for all the shot areas on the wafer with the reticle being moved forward or retracted shifted. Thereafter, the reticle is moved back and the alignment and exposure of each shot area may be carried out in a step-and-repeat manner. If this is desired, a sliding mechanism comprising a slider 50, such as shown in FIG. 5 may be provided. In the arrangement of FIG. 5, the reticle stage 30 and the reticle stage driver 31 are mounted on the slider 50. The slider 50 is arranged to slide along guide rails 51 to a solid-line position, at the time of resist elimination. This allows the excimer laser beam to pass through a window 52 and to be directly projected upon the wafer 16 by the projection optical system 15, without passing through the reticle 14. A driver 53 for moving the slider 50 is controllably operated under the direction of the CPU 40. The flow of the alignment and exposure operation with use of the FIG. 5 arrangement is illustrated in FIG. 4.

Referring now to FIG. 6, there is shown an optical arrangement of an alignment system included in an alignment and exposure apparatus according to another embodiment of the present invention. Like numerals as the FIG. 1 embodiment are assigned to similar or corresponding elements.

Denoted in FIG. 6 by numerals 19 and 19 are swingable mirrors which are operationally associated with the swingable mirror 8 in such a manner that, when the mirror 8 is in its solid-line position, the mirrors 19 are in their solid line positions and, when the mirror 8 is in the broken-line position, the mirrors 19 are in their broken-line position.

One of the distinct features of the present embodiment over the FIG. 1 embodiment is that the light reflected from the reticle alignment mark 14a-1 (14a-2), rather than the light transmitted through the reticle 14, is used for the alignment of the reticle 14 and the wafer 16. As illustrated in FIG. 6, the laser beam for the alignment as well as the laser beam for the resist elimination do not pass through the reticle 14, but bypass the reticle 14. After bypassing the reticle 14, the laser beam is incident upon the wafer 16. Upon commencing the alignment operation, the mirrors 8 and 19 are moved to their broken-line positions, so that the laser beam from the laser source 1 bypasses the reticle 14 and, then, is projected upon the reticle 14 surface adjacent to the reticle alignment mark 14a-1 (14a-2). Also, the laser beam reflected from the reticle 14 is incident upon the wafer 16 surface adjacent to the wafer alignment mark 16a-2 (16a-1). As in the case of the first embodiment, only the diffractively scattered light rays from the edges of the reticle alignment mark and the wafer alignment mark are received by the photodetectors 10-1 and 10-2.

Prior to the execution of such an alignment operation, the mirrors 8 and 19 are moved to their solid-line positions in FIG. 6, and the KrF excimer laser 11 is energized to produce a laser beam which is directed to the wafer 16 for the resist elimination purpose. Since the mirrors 19 are in their solid-line positions, the excimer laser beam for the resist elimination is not directed to the reticle alignment mark. As a result, no image of the reticle alignment mark is formed on the wafer 16. Therefore, there is no possibility that the resist material corresponding to the image of the reticle alignment mark remains on the wafer. It will be readily understood that, in the present embodiment, the necessity of changing the wavelength of the excimer laser beam or the necessity of shifting the reticle 14 at the time of resist elimination, as in the first embodiment, is avoided.

While in the first and second embodiments, a portion of the optical arrangement of the alignment optical system is used as a portion of the optical arrangement of the resist eliminating optical system, these optical systems may, of course, be provided completely independently. In such case, swingable mirrors 20, such as shown in FIG. 7 may be provided at positions above the wafer alignment marks, the mirrors 20 being operable to direct the resist eliminating laser beams to the wafer 16.

It is a possible alternative that the excimer laser 11 of the FIG. 1 embodiment and/or the FIG. 6 embodiment may be used as a radiation energy source for the exposure (photolithographic pattern transfer). That is, a swingable mirror may be provided at a suitable position so that, at the time of resist elimination, the swingable mirror is used to introduce the excimer laser beam into the resist eliminating optical arrangement described hereinbefore. This is very preferable with respect to cost, space, etc.

Figure 8:
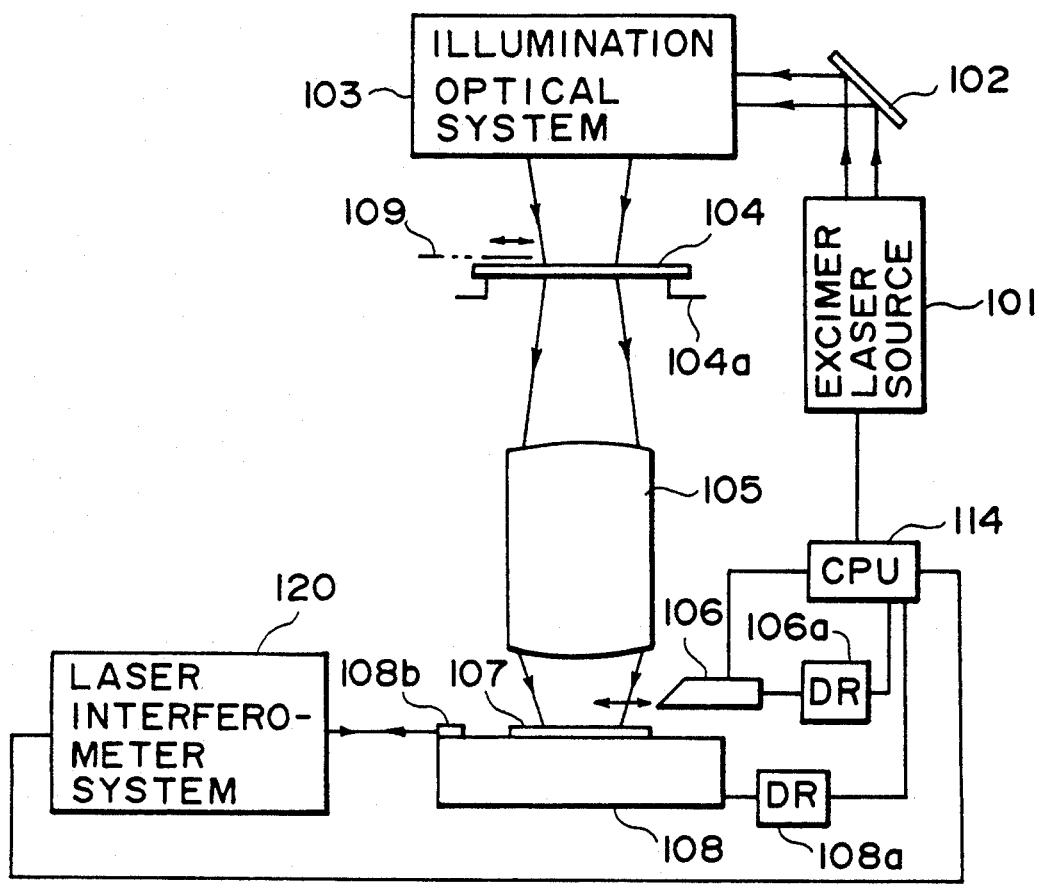
FIG. 8 is a schematic and diagrammatic view of an alignment and exposure apparatus according to a still further embodiment of the present invention.

Referring now to FIG. 8, there is shown an alignment and exposure apparatus according to a further embodiment of the present invention. One of the most important features of the present embodiment is that the system is arranged especially to form an image of a reticle alignment mark on a photoresist surface layer of a wafer. In other words, the system is arranged to transfer the reticle alignment mark onto the wafer, prior to the execution of the alignment operation. This will be described below in more detail.

As shown in FIG. 8, the apparatus includes an excimer laser source 101, a reflecting mirror 102, an illumination optical system 103, a reticle chuck 104a for carrying thereon and positioning a reticle 104, a projection optical system 105 for projecting an image of the reticle 104 upon a wafer 107 in a reduced scale, a wafer stage 108 for carrying thereon the wafer 107 and being movable in each of X, Y and θ directions, and a wafer stage driver 108a for moving the wafer stage in the X, Y and θ directions. The apparatus further includes a microscope optical system 106 which is provided for the observation of the upper surface of the wafer 107. The microscope optical system 106 contains a TV camera, not shown, adapted to pick up an image of the wafer 107 surface and to convert the image into electric signals. Driver 106a is provided move the same, at the time of observation, at least a portion of the optical arrangement of the microscope optical system 106 to a position allowing observation of one or more alignment marks formed on the wafer 7, and also to move, at the time of exposure, to a position that does not adversely affect projection of the image of the reticle pattern. A central processing unit 114 (hereinafter "CPU") is provided to receive the electrical signals from the TV camera of the microscope optical system 106 and, on the basis of image processing, detects the positional relation between the reticle 104 and the wafer 107. Also, the CPU 114 controls the energization of the excimer laser 101, the actuation of the driver 106a, the actuation of the wafer stage driver 108a, etc. Further, the CPU 114 is arranged so that positional information concerning approximate positions of different shot areas on the wafer 107 can be stored therein. Aperture member 109 is detachably inserted to a position above the reticle 104, for intercepting a portion of the laser beam directed to the reticle. Laser interferometer measuring system 120 is provided, which is arranged to emit measuring laser beams to a mirror 108b and to receive the laser beams reflected from the mirror 108b, to thereby measure or detect displacement of the wafer stage 108 in each of the X, Y and θ directions. The CPU 114 monitors outputs of the laser interferometer system 120 and, on the basis of which, calculates the current position of the wafer stage 108.

Figure 10:
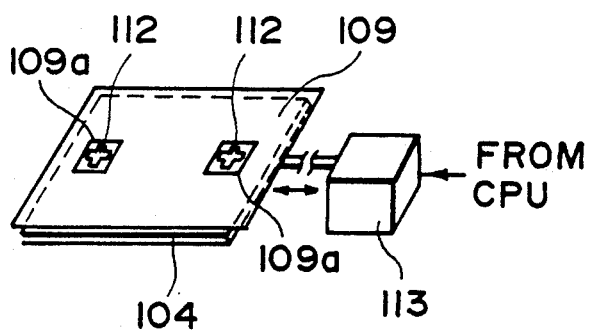
FIG. 10 is a schematic view showing a driving system for moving an aperture member.

FIG. 10 shows a driving system for moving the aperture member 109. Denoted at 109a in FIG. 10 are apertures or windows formed in the aperture member 109. These windows 109a are formed at positions corresponding to the positions of reticle alignment marks 112 formed on the reticle 104. Also, the size of each window 109a is selected so that the window defines, on the reticle 104, an irradiation area which sufficiently covers the corresponding reticle alignment mark 112, but which does not cover or partially cover a circuit pattern region of the reticle 104 (the region in which a circuit pattern, not shown, is formed). Actuator 113 is provided to drive the aperture member 109. For the purpose of alignment, the actuator 113 operates to place the aperture member 109 at a position which is above the reticle 104 and which is effective to allow irradiation of the reticle alignment marks 112 with the light beam emitted from the illumination optical system 103 and passing through the windows 109a of the aperture member 109. Also, for exposure purposes, the actuator 113 operates to move the aperture member 109 to a position outside the path of light from the illumination optical system. The operation of the actuator 113 is controlled by the CPU 114.

Figure 11:
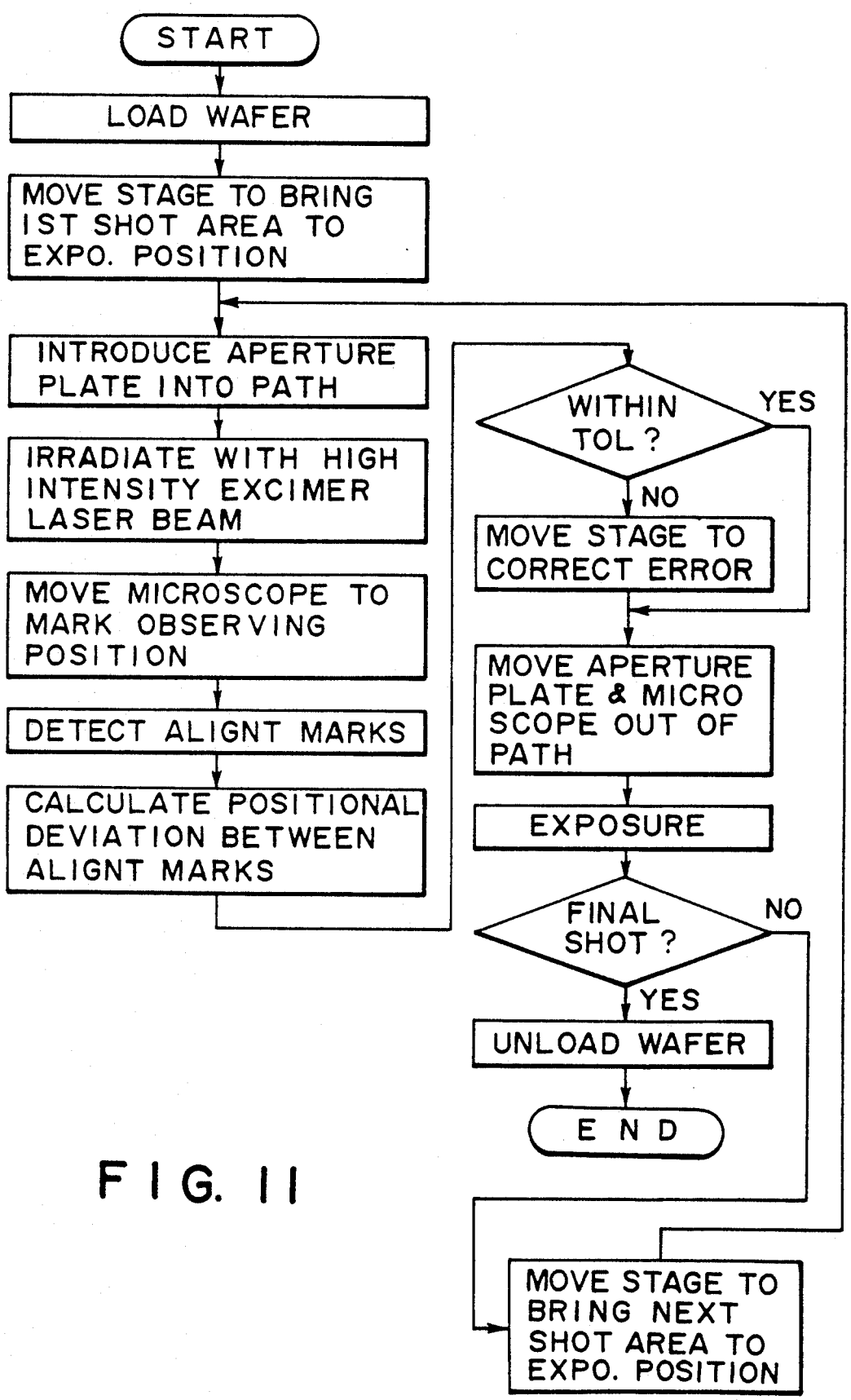
FIG. 11 is a flow chart showing the sequence of alignment and exposure operation in accordance with one embodiment of the present invention.

The laser beam emitted from the excimer laser 101 is deflected by the mirror 102 toward the illumination optical system 103. By this illumination optical system, the laser beam is transformed into a uniform light beam having a suitable numerical aperture (angular expansion), irradiating the reticle 104. Thus, the circuit pattern formed on the reticle 104 is transferred by means of the projection optical system 105 onto the wafer 107 held on the stage 108. This is the "exposure", i.e. "photoprinting". Prior to execution of such "exposure", the alignment operation is carried out. The manner of such alignment and exposure operation in the present embodiment, to be made under the direction of the CPU 114, is illustrated in a flow chart of FIG. 11. The flow chart will be described below in more detail.

First, a wafer is introduced into the apparatus and placed on the wafer stage (wafer loading). Then, in accordance with the positional information having been preparatorily stored in the CPU 114, the wafer stage is moved so as to place a first shot area on the wafer at the exposure position. Thereafter, the aperture member 109 is moved into the path of the light to be supplied from the illumination optical system 103, and to a position close to and above the reticle 104. At this time, the actuator 113 operates to position the aperture member 109 so that only the reticle alignment marks 112 and the reticle surface portions in the neighborhood thereof can be irradiated with the light beams passing through the windows 109a, respectively, as seen from FIG. 10. Thereafter, the excimer laser 101 is energized under the influence of the CPU 114 so that it emits a laser beam having an intensity which is significantly higher than that to be used for "exposure" or "photoprinting" described above.

Figure 9:
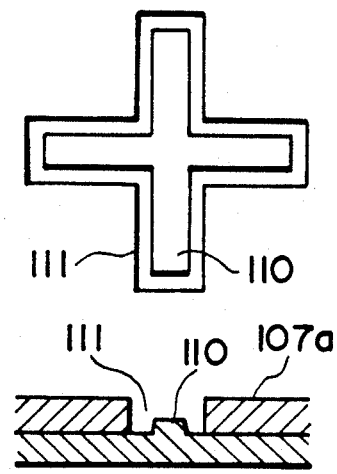
FIG. 9 is an explanatory view showing a wafer alignment mark formed on a wafer and a reticle alignment mark having been transferred onto a resist layer on the wafer, in accordance with one aspect of the present invention.

When the reticle alignment mark is defined by a light-transmitting region, the thickness of only such portion of the resist layer on the wafer 107 that corresponds to the region of the reticle alignment mark is reduced, due to photochemical action and thermal action of the high-intensity deep-UV rays from the excimer laser. Further, by increasing the intensity of the excimer laser beam, the portion of the resist material irradiated with the excimer laser beam is completely eliminated. Thus, by adjusting the intensity of the excimer laser beam, an image of the reticle alignment mark can be formed, as a visible image, on the wafer in the form of the recess or protrusion, or surface irregularity. In other words, the reticle alignment mark is transferred onto or reproduced on the resist layer. FIG. 9 shows an example of a reticle alignment mark image 111 as transferred onto a resist layer 107a. Denoted at 110 in FIG. 9 is a wafer alignment mark formed on the wafer.

After transferring or forming reticle alignment marks on the wafer 107, the CPU 114 produces instruction signals which are supplied to the driver 106a so as to set the microscope optical system 106 to allow observation of the wafer alignment marks and the thus transferred reticle alignment marks, simultaneously. After this, by use of suitable illumination means (not shown) included in the microscope optical system 106, both the wafer alignment marks and the transferred reticle alignment marks are illuminated with light of a particular wavelength or wavelength range which is different from the wavelength used for the photoprinting and which is not easily absorbed by lower layers of a multilayer-type photoresist surface layer, where it is used. The image of the wafer, including two kinds of alignment marks described above, is picked up by the TV camera of the microscope optical system, and the image is converted into electrical signals which are subsequently supplied to the CPU 114. On the basis of the image processing, the CPU 114 detects any positional deviation between the wafer alignment mark and the reticle alignment mark, both on the wafer. In accordance with this detection, the driver 108a operates to displace the wafer stage 108 by a necessary distance from its current position. By this, the alignment of the reticle and the wafer is accomplished.

Thereafter, the aperture member 109 and the microscope optical system 106 is moved out of the path of the light beam, and then the photolithographic transfer of the circuit pattern of the reticle is executed. After completion of such photoprinting, the wafer stage is moved in accordance with the stored positional information so as to bring the next shot area of the wafer to the exposure position. The above-described operation is repeated for each of the remaining shot areas on the wafer 107, in the step-and-repeat manner, whereby the photolithographic process for one wafer is completed.

In accordance with the present embodiment, as described hereinbefore, the image of the reticle alignment mark is formed on the resist layer applied to the wafer surface, in the form of a recess. Accordingly, the reticle alignment mark, as transferred, can easily be detected by use of conventional photoelectric converting means.

It will be readily understood that the concept of the present embodiment is also applicable to a reticle alignment mark being defined by a light-intercepting region and the reticle surface portion encircling such reticle alignment mark being formed by a light-transmitting region. Substantially the same advantageous effects are obtainable in such a case.

In accordance with the present embodiment, as is best seen from FIG. 9, the position detection for the alignment purpose can be made on the basis of detection of edges defined on the resist layer. Accordingly, the microscope optical system 106 may comprise an observation optical system arranged for providing a dark-field illumination. This will be effective to improve detection accuracy.

Further, as illustrated in FIG. 9 which comprises a plan view portion (upper half) and a sectional view portion (lower half), it is preferable to determine or select the shape and size of the reticle alignment mark so as to assure that an image 111 of the reticle alignment mark to be transferred onto the resist layer 107a on the wafer has a range or extension that is greater than the sum of the size of the wafer alignment mark 110 and the maximum expected positional deviation of the wafer alignment mark. In other words, the reticle alignment mark 112 is preferably determined so that the image 111 of the reticle alignment mark always covers the wafer alignment mark 110. It is also desirable to form the reticle alignment mark 112 by a light-transmitting region and to use a resist eliminating excimer laser beam having an intensity which is sufficiently high for completely eliminating the resist material within the range of the image of the reticle alignment mark. When this is done, the wafer alignment mark 110 can be "revealed" completely. Therefore, any error in the position detection due to uneven thickness of the resist layer can be avoided.

When the required amount of exposure for the photoprinting of the circuit pattern differs remarkably from the required amount of exposure for the transfer of the reticle alignment mark described above, because of the property of a resist material used or for any other reason, separate excimer laser sources may preferably be used for respective purposes in order to obviate difficulties in the control of the exposure amount.

As a possible alternative, the resist eliminating operation and the deviation detecting operation may be preparatorily executed for each of the shot areas on a wafer. Further, in such case, the location of each shot area as defined at the time of a corresponding resist eliminating operation may be detected by means of the laser interferometer system 120 and, on the basis of the detected deviation and location, a desired position of each shot area with respect to the reticle may be calculated and stored. After completion of the calculations of the desired positions with regard to all the shot areas on the wafer, the wafer is moved stepwise in sequence, while aiming at the stored "desired positions". If this is done, then the stepwise movement of the wafer is directly followed by "photoprinting".

The excimer laser beam used in the foregoing embodiments to eliminate the resist material on and in the neighborhood of an alignment mark may, of course, be replaced by other types of short-wavelength electromagnetic waves. Substantially the same advantageous effects are obtainable. Further, electron beams or ion beams may be used. If desired, suitable etching means may be used for the resist elimination.

While, in the foregoing embodiments, the invention has been described with reference to cases wherein an excimer laser beam is used to remove or eliminate a resist material on a wafer, the concept of the present invention is, of course, applicable to removal of a surface layer on an object, disposed in an ambience containing an etching gas, by use of irradiation with suitable radiation energy, such as an excimer laser beam.

While the invention has been described with reference to the structures disclosed herein, it is not confined to the details set forth and this application is intended to cover such modifications or changes as many come within the purposes of the improvements or the scope of the following claims.

What is claimed is:

1. A method of aligning a mask and a wafer by use of alignment marks formed on the mask and the wafer, the wafer further having a radiation-sensitive layer, said method comprising the steps of:
    removing the radiation-sensitive layer on the wafer in accordance with a pattern of the alignment mark of the mask, wherein the radiation-sensitive layer is removed by irradiating the radiation-sensitive layer with a radiation beam of a predetermined energy passed through the alignment mark of the mask so that, by the removal of the radiation-sensitive layer resulting from the irradiation, the pattern of the alignment mark of the mask is transferred onto the wafer, and wherein a portion of the radiation-sensitive layer covering the alignment mark of the wafer is removed as a result of the irradiation;
    detecting the positional interrelation between the alignment mark of the wafer not covered by the radiation-sensitive layer and the pattern of the alignment mark of the mask transferred onto the wafer by the removal of the radiation-sensitive layer; and
    aligning the mask and the wafer on the basis of the detection.

2. A method according to claim 1, wherein said removing step comprises the step of producing the radiation beam with an excimer laser.

3. A method according to claim 1, wherein said removing step comprises the step of directing the radiation beam to the radiationsensitive layer on the wafer through a projection optical system for projecting an image of the mask upon the wafer.

4. A projection exposure apparatus for printing a pattern of a reticle onto a wafer including an alignment mark and a radiation-sensitive layer at least covering the alignment mark, said apparatus comprising:
    a reticle stage for supporting the reticle;
    a wafer stage for supporting the wafer;
    a projection optical system provided between the reticle and the wafer, for projecting the pattern of the reticle upon the wafer;
    removing means for removing a portion of the radiation sensitive layer covering the alignment mark, wherein said removing means includes irradiating means, having an optical system, for irradiating said portion of the radiation sensitive layer with a radiation beam having a predetermined energy so as to remove said portion of the radiation sensitive layer;
    mark detecting means for optically detecting through said optical system of said irraidating means the alignment mark of the wafer supported by said wafer stage, the radiation-sensitive layer on which mark has been removed by the irradiation with the radiation beam; and
    adjusting means for adjusting the positional relationship between the reticle and the wafer on the basis of the detection of said mark detecting means.

5. An apparatus according to claim 4, wherein said irradiating means comprises a radiation source for supplying the radiation beam through the projection optical system for printing the pattern of the reticle on the wafer.

6. An apparatus according to claim 4, wherein the wafer comprises a first alignment mark and a second alignment mark and wherein said irradiating means comprises a radiation source for supplying the radiation beam and directing means for dividing the radiation beam into first and second beam portions and directing the first beam portion to a portion of the radiation sensitive layer of the wafer covering the first alignment mark of the wafer and directing the second beam portion to another portion of the radiation sensitive layer of the wafer covering the second alignment mark of the wafer.

7. An apparatus according to claim 4, wherein said irradiating means comprises an excimer laser for providing an excimer laser beam as the radiation beam.

8. An apparatus according to claim 7, wherein said projection optical system comprises means for projecting the pattern of the reticle upon the wafer by the excimer laser beam.

9. An apparatus according to claim 8, wherein said mark detecting means comprises light projecting means for directing a predetermined light beam to the alignment mark of the wafer through said projection optical system and photoelectric converting means for photoelectrically converting light reflected from the alignment mark of the wafer.

10. An apparatus according to claim 7, wherein said irradiating means comprises means for directing the laser beam from said excimer laser through said projection optical system and the reticle to the radiation sensitive layer.

11. An exposure apparatus for printing a particular pattern of a mask on a workpiece having a radiation sensitive layer, said apparatus comprising:
    a mask holder for holding the mask;
    a workpiece holder for holding the workpiece;

removing means for removing the radiation sensitive layer of the workpiece in accordance with a pattern of an alignment mark of the mask, wherein said removing means includes irradiating means for irradiating the radiation sensitive layer of the workpiece with radiation energy projected through the pattern of the alignment mark of the mask so that, by the removal of the radiation sensitive layer resulting from the irradiation, the pattern of the alignment mark is printed on the workpiece, and wherein a portion of the radiation sensitive layer covering the alignment mark of the workpiece is removed as a result of the irradiation; and detecting means for detecting the alignment mark of the mask printed on the workpiece and the alignment mark of the workpiece not covered by the radiation sensitive layer.

12. An apparatus according to claim 11, further comprising adjusting means for adjusting a positional relationship between the mask and the workpiece in accordance with the detection by said detecting means.

13. An apparatus according to claim 11, wherein said detecting means comprises means for detecting the alignment mark of the mask printed on the workpiece in a dark field.

14. An apparatus according to claim 11, wherein said irradiating means comprises an excimer laser for projecting a laser beam to the radiation sensitive layer as the radiation energy.

15. An apparatus according to claim 14, wherein said irradiating means further comprises an illumination optical system for directing the laser beam from said excimer laser to the alignment mark of the mask, and a projection optical system for projecting an image of the pattern of the alignment mark of the mask illuminated by the laser beam onto the radiation sensitive layer of the workpiece.

16. An apparatus according to claim 15, wherein the particular pattern of the mask comprises a circuit pattern for manufacture of a microcircuit and wherein said irradiating means further comprises means for projecting an image of the circuit pattern of the mask onto the radiation sensitive layer of the workpiece through said projection optical system for printing the circuit pattern on the workpiece.

17. An apparatus according to claim 16, wherein said irradiating means further comprises means for changing the intensity of the laser beam and wherein the intensity of the laser beam for printing the pattern of the alignment mark of the mask on the workpiece is higher than the intensity of the laser beam for printing the circuit pattern on the workpiece.

18. An exposure apparatus for exposing a workpiece to a mask having a particular pattern and an alignment mark, the workpiece having a surface layer, said apparatus comprising:

a mask holder for holding the mask;

a workpiece holder for holding the workpiece;

removing means for removing the surface layer of the workpiece held by said workpiece holder in accordance with a pattern of the alignment mark of the mask, wherein said removing means includes irradiating means for irradiating the surface layer of the workpiece with radiation energy projected through the alignment mark of the mask so that, by the removal of the surface layer of the workpiece, the pattern of the alignment mark of the mask is printed on the workpiece, and wherein a portion of the surface layer covering the alignment mark of the workpiece is removed as a result of the irradiation; and detecting means for detecting the alignment mark of the mask printed on the workpiece and the alignment mark of the workpiece not covered by the radiation sensitive layer.

19. An exposure apparatus for exposing a wafer having an alignment mark to a mask, the wafer having a radiation-sensitive layer, said apparatus comprising:

a mask stage for supporting the mask;

a wafer stage for supporting the wafer;

aligning means for adjusting the relative position of the mask and the wafer, said aligning means including removing means, detecting means, and an adjusting mechanism; and exposing means for exposing the wafer to the mask, the relative position of the mask and wafer having been adjusted by said aligning means;

wherein said removing means is arranged to remove a portion of the radiation sensitive layer on the wafer about the alignment mark thereof and wherein said removing means includes irradiating means, having an optical system, for irradiating said portion of the radiation sensitive layer with a radiation beam having a predetermined energy so as to remove, by the irradiation, said portion of the radiation-sensitive layer; and wherein said detecting means is arranged to optically detect, through said optical system, the alignment mark of the wafer supported by said wafer stage, said portion of the radiation sensitive layer about the alignment mark having been removed by the irradiation with the radiation beam, and said adjusting mechanism is arranged to adjust the relative position of the mask and the wafer on the basis of the detection by said detecting means.

20. A method of detecting a positional relationship between a first substrate having a first alignment mark and a second substrate having a second alignment mark and having a surface covered by a radiation-sensitive layer, said method comprising the steps of:

projecting radiation energy through the first alignment mark of the first substrate to the radiation-sensitive layer of the second substrate to remove a portion of the radiation-sensitive layer of the second substrate, wherein, by the removal, the second alignment mark of the second substrate is uncovered while the pattern of the first alignment mark of the first substrate is printed on the second substrate; and detecting the positional relationship between the first and second substrates by using the uncovered second alignment mark of the second substrate and the printed pattern of the first alignment mark of the first substrate.

21. A method according to claim 20, wherein the radiation energy projected in said projecting step is provided by an excimer laser beam.

22. A method according to claim 21, wherein the removal of the portion of the radiation-sensitive layer in said projecting step is effected by projecting an image of the first mark of the first substrate upon the second alignment mark of the second substrate by using the radiation energy.

23. In a semiconductor device manufacturing method usable with a mask having a first alignment mark and a wafer having a second alignment mark and having a surface covered by a radiation-sensitive layer, wherein a positional deviation of the wafer from the mask is detected and, after correction of the positional deviation, the wafer is exposed to a circuit pattern of the mask with radiation, the improvement comprising the steps of:

projecting radiation energy through the first alignment mark of the mask to the radiation-sensitive layer of the wafer to remove a portion of the radiation-sensitive layer of the wafer, wherein, by the removal, the second alignment mark of the wafer is uncovered while the pattern of the first alignment mark of the mask is printed on the wafer; and detecting the positional deviation of the wafer from the mask by using the printed pattern of the first alignment mark of the mask.

24. A method according to claim 23, wherein the radiation energy projected in said projecting step is provided by an excimer laser beam.

25. A method according to claim 23, wherein the removal of the portion of the radiation-sensitive layer in said projecting step is effected by projecting an image of the first alignment mark of the mask upon the second alignment mark of the wafer by using the radiation energy.

* * * * *

UNITED STATES PATENT AND TRADEMARK OFFICE
CERTIFICATE OF CORRECTION

PATENT NO. : 5,231,471
DATED : July 27, 1993
INVENTOR(S) : Makoto TORIGOE

It is certified that error appears in the above-indentified patent and that said Letters Patent is hereby corrected as shown below:

Column 1
    Line 21, "energy" should read --energy,--; and
    Line 64, "affects" should read --effects--.

Column 2
    Line 23, "flow chart" should read --flowchart--;
    Line 26, "flow chart" should read --flowchart--; and
    Line 49, "flow chart" should read --flowchart--.

Column 5
    Line 29, "since," should read --since--; and
    Line 35, "Accodingly," should read --Accordingly,--.

Column 6
    Line 36, delete "shifted".

Column 11
    Line 68, "radiationsensitive" should read --radiation-sensitive--.

Signed and Sealed this

Tenth Day of May, 1994

Attest:

BRUCE LEHMAN

*Attesting Officer*      *Commissioner of Patents and Trademarks*